(12) United States Patent
La Placa et al.

(10) Patent No.: US 7,826,284 B2
(45) Date of Patent: Nov. 2, 2010

(54) SENSE AMPLIFIER CIRCUIT AND METHOD FOR SEMICONDUCTOR MEMORIES WITH REDUCED CURRENT CONSUMPTION

(75) Inventors: Michele La Placa, Cefalú (IT); Ignazio Martines, Tremestieri Etneo (IT)

(73) Assignee: STMicroelectronics S.R.L., Agrate Brianza (IT)

( * ) Notice: Subject to any disclaimer, the term of this patent is extended or adjusted under 35 U.S.C. 154(b) by 615 days.

(21) Appl. No.: 11/726,993

(22) Filed: Mar. 23, 2007

(65) Prior Publication Data

US 2007/0242541 A1 Oct. 18, 2007

(30) Foreign Application Priority Data

Mar. 23, 2006 (IT) .......................... MI2006A0536

(51) Int. Cl.
G11C 11/063 (2006.01)
(52) U.S. Cl. .................... 365/196; 365/207; 365/185.21
(58) Field of Classification Search ............ 365/185.21, 365/185.2, 205, 196
See application file for complete search history.

(56) References Cited

U.S. PATENT DOCUMENTS

2005/0201169 A1* 9/2005 Demange et al. ............ 365/205
2006/0215463 A1* 9/2006 Vimercati et al. ...... 365/189.07
2008/0013381 A1* 1/2008 Giambartino et al. .. 365/185.21

FOREIGN PATENT DOCUMENTS

EP 1467377 A1 10/2004
EP 1505605 A1 2/2005

* cited by examiner

Primary Examiner—Vu A Le
Assistant Examiner—Han Yang
(74) Attorney, Agent, or Firm—Lisa K. Jorgenson; Paul F. Rusyn; Graybeal Jackson LLP

(57) ABSTRACT

A sensing circuit for a semiconductor memory, includes, a detecting amplifier including a first circuital branch is run through by a first current corresponding to the sum of a second current as a function of a comparison current and a cell current. The cell current is a function of a state of a memory cell to be read in a predetermined biasing condition. A second circuital branch is coupled as a current mirror configuration with the first circuital branch. The second circuital branch is run through by a third current proportional to the first current. A third circuital branch coupled to the second branch sinks a fourth current as a function of the comparison current. A fourth circuital branch coupled to is run through by a residual current equal to the difference between the third and the fourth current. The residual current assumes different values depending on the fact that the cell current is lower, equal or higher than the comparison current. A residual current sensitive means generates an indication of the state of the memory cell as a function of a value of the residual current.

28 Claims, 3 Drawing Sheets

SENSE AMPLIFIER CIRCUIT AND METHOD FOR SEMICONDUCTOR MEMORIES WITH REDUCED CURRENT CONSUMPTION

PRIORITY CLAIM

The present application claims the benefit of Italian Patent Application No. MI2006A000536, filed Mar. 23, 2006, which application is incorporated herein by reference in its entirety.

TECHNICAL FIELD

Embodiments of the present invention relate to the field of semiconductor memories. More specifically, embodiments of the present invention relate to the reading operation of semiconductor memories.

BACKGROUND

Semiconductor memories are commonly used in several applications for storing information, temporarily, in the so-called volatile memories, or permanently, in the so-called non-volatile memories, which are able to preserve the information also in absence of power supply. A non-volatile semiconductor memory comprises a matrix of memory cells, arranged in rows and columns to which there are respectively associated so-called word lines and bit lines. For example, the cells may be floating-gate MOSFETs. Each memory cell has a threshold voltage which may be programmed to different levels, to which respective logic values correspond.

A very common type of memory is the so-called "flash" memory, which, in addition to the non-volatility, offers the possibility of electrically writing and erasing the memory cells. For example, in the bi-level flash memories, wherein each cell is adapted to store one only information bit, in an erased condition the generic memory cell has a relatively low threshold voltage (the logic value 1 is typically associated thereto). The cell is programmed by means of the injection of electrons into the floating gate thereof. In such a condition the memory cell has a higher threshold voltage (the logic value 0 is typically associated thereto). In multi-level flash memories, each memory cell is adapted to store more than one information bit, and it can be programmed in a selected one of a plurality of different states, to which respective values of the threshold voltage correspond. For example, in a memory which operates with four levels (a so-called four-level memory), each memory cell stores a logic value which consists of two information bits (that is, 11, 10, 01 and 00, as the threshold voltage of the memory cell increases).

For retrieving the stored information, the semiconductor memories comprise reading circuitries adapted to read the data stored in the memory cells. In particular, the logic values stored in the selected memory cells are read by comparing a current flowing through each memory cell with the currents provided by one or more reference cells, programmed in a predetermined condition. For this purpose, the reading circuitry also applies a suitable biasing voltage to the selected memory cells and the reference cells. The comparison operation between the currents flowing respectively through the selected memory cell and the reference cells is typically performed by sense amplifiers, included in the reading circuitry and adapted to provide an indication of the stored logic value depending on the output voltage thereof.

Typically, the sense amplifiers used in the semiconductor memories provide for the use of differential amplifiers adapted to control and stabilize the voltage of a bit line to which the selected memory cell is connected during the reading operations. The Applicant has observed that the use of differential amplifiers implies high current absorptions during the conventional operations (such as the reading) performed on the memory device.

The problem becomes more noticeable as the number of sense amplifiers which have to be integrated in the memory increases. For example, in the case of flash memories, wherein distinct individually-erasable memory sectors are often provided for, the sectors being grouped to form so-called memory partitions, each one comprising a predetermined number of sectors (for example, 16 sectors), for each memory partition a plurality of sense amplifiers has to be provided (for example, 128 sense amplifiers in the case in which for each sector one desires to read sixteen words at the same time, each comprising 8 memory cells). In general, as the partitioning of the memory increases, the number of sense amplifiers increases, and thus the current consumption becomes significant.

In other words, the current consumption of the reading circuitry is more and more a limiting aspect in semiconductor memories which require a high number of sense amplifiers during the reading operations, thus contrasting the increasing requirement of optimizing the data storage capacity to power dissipation ratio.

Moreover, the differential amplifiers have the drawback of occupying a significant area of the semiconductor material chip wherein the memory is integrated.

Also in this case, the problem becomes more noticeable as the number of the sense amplifiers which have to be integrated in the memory increases.

SUMMARY

Embodiments of the present invention are based on the idea of reducing the number of differential amplifiers provided in the reading circuitry, in order to reduce the current absorption and the size of the memory.

In particular, an embodiment of the present invention proposes a detecting circuit for a semiconductor memory, comprising at least one sense amplifier. The sense amplifier comprises a first circuital branch adapted to be run through by a first current corresponding to the sum of a second current being a function of a comparison current and a cell current, the cell current being a function of a state of a memory cell to be read in a predetermined biasing condition. A second circuital branch is coupled in a current mirror configuration to the first circuital branch, the second circuital branch being adapted in the operation to be run through by a third current proportional to the first current. A third circuital branch is coupled to the second branch, the third circuital branch being adapted in the operation to absorb a fourth current being a function of the comparison current. A fourth circuital branch is coupled to the second and third circuital branches, said fourth circuital branch being adapted in the operation to be run through by a residual current equal to the difference between the third and the fourth currents. The residual current assumes different values depending on whether the cell current is lower, equal or higher than the comparison current. Means are sensitive to the residual current and adapted to generate an indication of the state of the memory cell as a function of a value of the residual current.

BRIEF DESCRIPTION OF THE DRAWINGS

The invention, and advantages thereof will be made apparent by the following detailed description of embodiments of the invention, which are, provided merely by way of non-limitative example, and are to be read in combination with the attached drawings.

DETAILED DESCRIPTION

The following discussion is presented to enable a person skilled in the art to make and use the invention. Various modifications to the embodiments will be readily apparent to those skilled in the art, and the generic principles herein may be applied to other embodiments and applications without departing from the spirit and scope of the present invention. Thus, the present invention is not intended to be limited to the embodiments shown, but is to be accorded the widest scope consistent with the principles and features disclosed herein.

Figure 1:
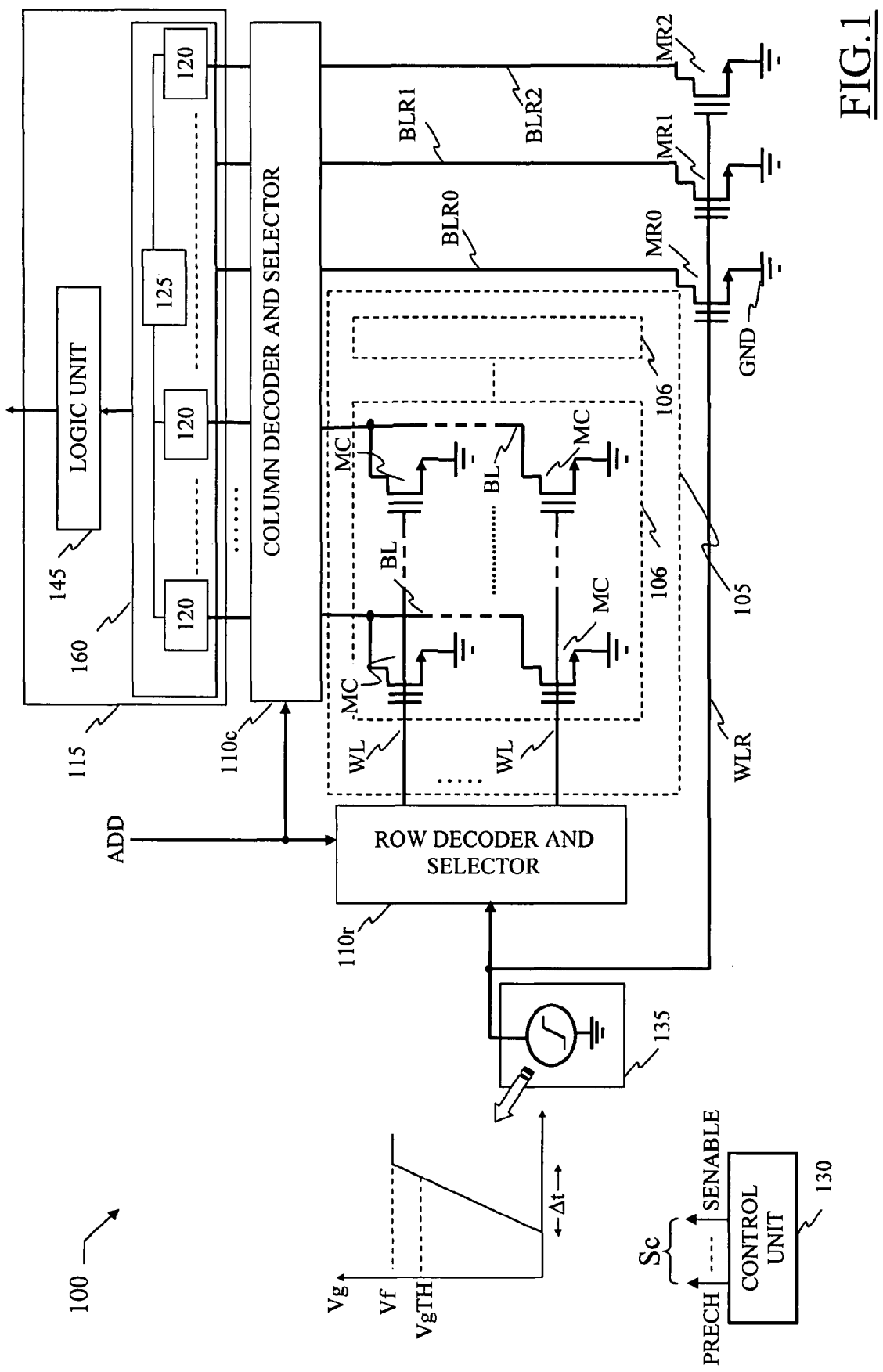
FIG. 1 shows a principle schematic block diagram of a memory device wherein embodiments of the present invention can be used, with the diagram being limited to the blocks relevant for understanding the invention.

Referring to FIG. 1, a semiconductor memory device 100 is shown, particularly an electrically programmable and erasable non-volatile memory, for example of flash type. The memory device 100 comprises a matrix 105 of flash memory cells MC, typically formed by floating gate MOSFETs, each memory cell having a programmable threshold voltage. In particular, the matrix 105 may comprise a plurality of partitions 106, each of which comprises a plurality of sectors (for example, 16) of memory cells MC, where sector is to be intended as the smallest set of memory cells individually erasable with respect to the remaining sectors.

The memory cell MC in a non-programmed (or erased) condition exhibits a low threshold voltage. The memory cell MC is programmed by injecting electrical charge into the floating gate thereof. The memory cell MC can be programmed to multiple levels, each of which is associated with a corresponding range of threshold voltages. For example, in a four-level memory, each memory cell MC stores a logic value consisting of two information bits (11, 10, 01 and 00 as the threshold voltages increases).

The matrix 105 is associated with a plurality of reference flash memory cells, which are used during a reading operation for discriminating the logic values stored in the selected memory cells MC. In the example at issue, three reference flash memory cells MR0, MR1 and MR2 are indicated, whose threshold voltages are set to predetermined values which are intermediate to the threshold voltage levels associated with the logic values 11-10, 10-01 and 01-00, respectively.

In the matrix 105, the memory cells MC are arranged according to a NOR architecture. In particular, the drain terminals of the memory cells MC of each column are connected to a corresponding bit line BL, whereas the gate terminals of the memory cells MC of each row are connected to a corresponding word line WL. Finally, the source terminals of all the memory cells MC of a same sector are connected to a common source terminal which provides the suitable voltages depending on the operations to be performed (for example, it provides a first reference voltage GND or ground during read and program).

Similarly, the drain terminals of the reference cells MR0, MR1 and MR2 are respectively connected to a corresponding reference bit line BLR0, BLR1 and BLR2. The gate terminals of all the reference memory cells MR0, MR1 and MR2 are connected to a common word line WLR. However, nothing prevents from connecting the gate terminals of the reference cells to different word lines, provided they are suitably driven whereas the source terminals thereof are kept at ground.

For selecting the memory locations, the memory device 100 receives an address code ADD, for example coming from outside the memory device. A portion of the address code ADD is provided to a row decoder and selector 110r, and another portion of the address code ADD is provided to a column decoder and selector 110c.

The column decoder and selector 110c interfaces the matrix 105 of cells with a reading block 115, comprising a sensing circuit 160 of the state of the cells, and a reconstruction logic unit 145 of the stored data.

In detail, in an embodiment of the invention, the sensing circuit 160 comprises a plurality of sense amplifiers for each partition of the memory. The number of sense amplifiers depends on the number of memory cells to be read in parallel in each sector and provides for a common biasing voltage generator 125 for all the sense amplifiers 120 related to all the partitions. In particular, the biasing voltage generator 125 provides to each plurality of sense amplifiers 120 the voltages needed for the correct operation thereof during the reading operation of the data stored in each selected partition 106.

For example, during a reading operation, depending on the received address code ADD, the row decoder and selector 110r and the column decoder and selector 110c select a word line WL and one or more bit lines BL, respectively. For example, a word line and, in each sector, 8 or 16 bit lines, for reading 8 or 16 memory cells for each sector at the same time.

By means of the row decoder and selector 110r and the column decoder and selector 110c, a set of memory cells MC in each sector (for example, 8), which store a data word (16 bits in the case at issue) can be electrically coupled to the reading block 115. In particular, the column decoder and selector 110c allows coupling each selected bit line BL to a corresponding sense amplifier 120 included in the reading block 115. The remaining bit lines BL are instead left floating, or alternatively they are grounded. The row decoder and selector 110r biases from time to time the selected word lines WL to a suitable reading voltage, while the remaining word lines WL are for example kept grounded.

Moreover, the memory device 100 comprises a control unit 130, which generates control signals (denoted collectively as a whole as Sc), which, by means of corresponding control signal lines, are used for driving the various components (such as the sense amplifiers 120) during the operation thereof (for example, during the reading operation). For example, the control signals Sc comprise a precharging signal PRECH and an enabling signal SAENABLE adapted to control the operation of the memory device 100 during a reading operation of the selected memory cells MC.

Moreover, the row decoder and selector 110r couples the selected word line WL to a voltage generator 135. The example shown and described refers to a so-called "voltage ramp" reading technique, described for example in European Patent Application No. 03017939.4 and in European Patent Application Publication No. EP 1467377, each of which is incorporated herein by reference.

Figure 3:
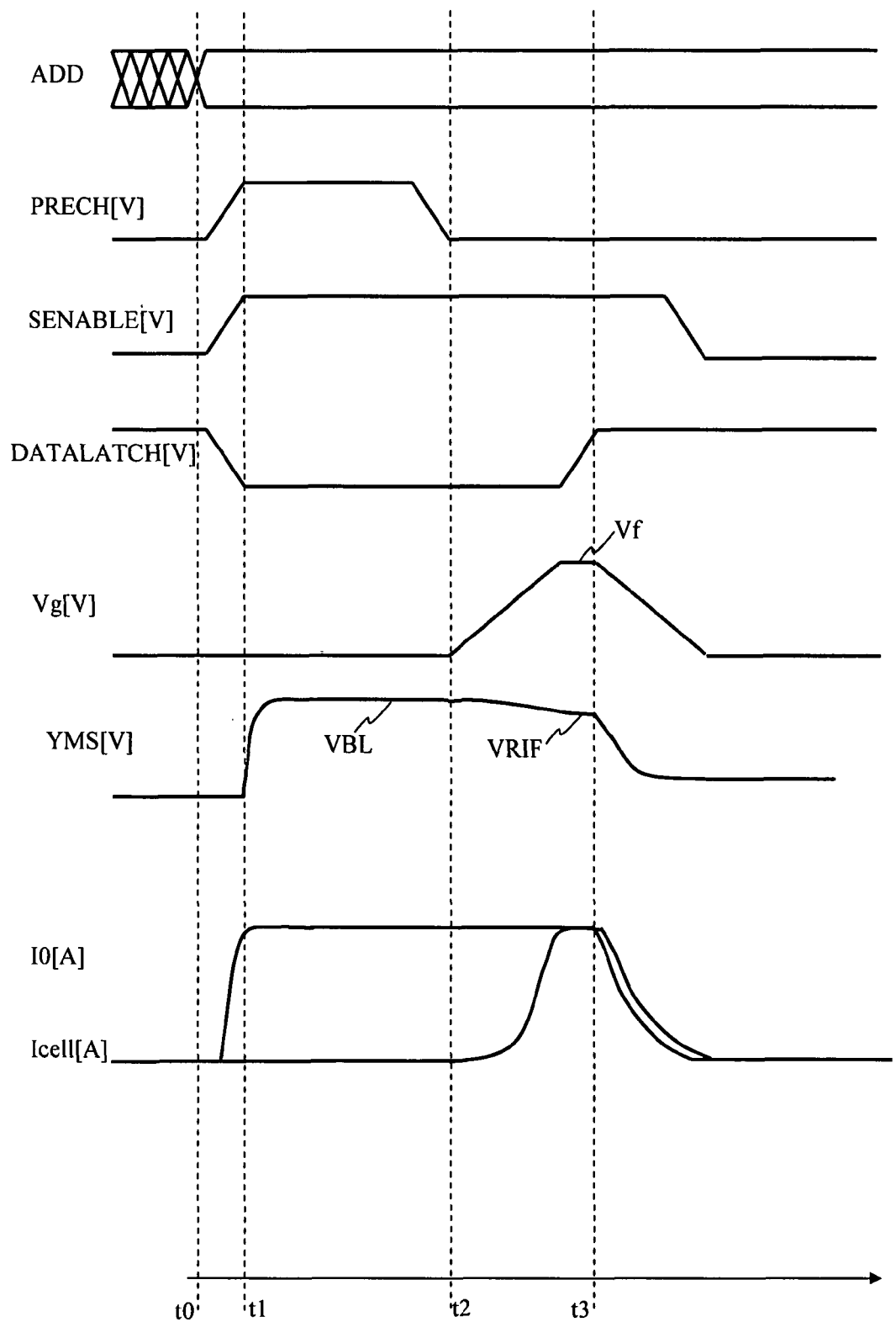
FIG. 3 schematically shows timing diagrams explaining the operation of the reading circuitry shown in FIG. 2, according to an embodiment of the present invention.

In this case, the ramp voltage generator 135 applies a suitable biasing voltage Vg to the control terminals of the selected memory cells, which, in case of voltage ramp reading, follows a trend varying in time, particularly a monotonically increasing trend, for example a linearly increasing trend, such as a voltage ramp. As shown in FIG. 3, during a reading operation, the reading voltage Vg, starting from a very low or substantially zero value (for example, equal to the ground), reaches a final value Vf in a predetermined time Δt (for example, equal to 10 ns).

In particular, in case the selected memory cell MC stores more than one information bit, for example two information bits, the final value Vf exceeds a voltage value VgTH that is the highest threshold voltage value of the memory cells MC (corresponding by convention to the logic state 00) when they are programmed.

The same biasing voltage Vg is applied to the control terminals of the reference memory cells MR0, MR1 and MR2.

The column decoder and selector 110c couples the selected bit lines to the sense amplifiers 120, included in the reading block 115. The sense amplifiers 120 have all the same circuital structure. Moreover, each bit line BLR0, BLR1 and BLR2 is coupled to a corresponding sense amplifier 120.

During the reading operation, each sense amplifier 120 compares the currents flowing through the selected memory cell MC and the reference cells MR-MR2 with a comparison current having a predetermined value, so as to detect the turning on thereof. In other words, each sense amplifier 120 is adapted to detect the conduction state of the selected memory cell or the reference memory cell when the current, which runs through the cell, exceeds the value of the comparison current.

For this purpose, the comparison current (in the following referred to as I0) has a value which is chosen in such a way that the cell of the matrix, or the generic reference cell, is detected as conductive when the difference between the voltage applied to the gate and source terminals of the cell and the respective threshold voltage reaches a predetermined value, not too small for avoiding errors originating from noise (for example, the comparison current I0 may have a value ranging from 6 to 10 μA).

The result of the comparison between the currents is provided to the reconstruction logic unit 145, which determines the logic value stored in each selected memory cell MC depending on the timing according to which the selected memory cell MC turns on compared to instants at which the reference cells MR0, MR1 and MR2 turn on.

Figure 2:
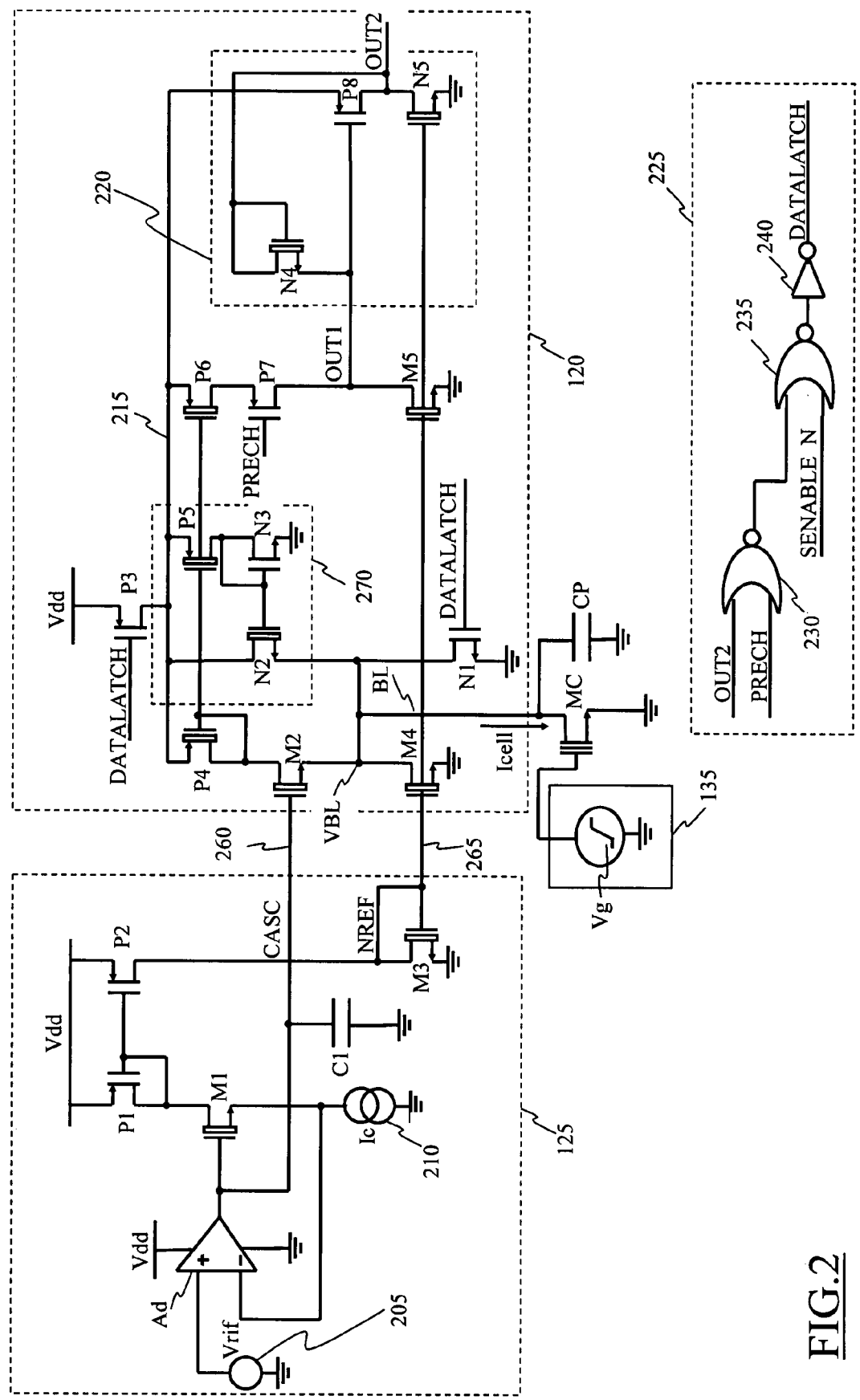
FIG. 2 shows a circuital scheme of a reading circuitry according to an embodiment of the present invention.

With reference to FIG. 2, an exemplary scheme of a portion of the reading block 115 is shown, limitedly to some blocks relevant for the understanding embodiments of the present invention. In particular, a sense amplifier 120 adapted to read the data (or logic value) stored in the selected memory cell MC and the biasing voltage generator 125 adapted to generate the biasing voltages needed during the operation of the sense amplifier 120 are depicted.

The biasing voltage generator 125 supplies all the sense amplifiers 120 of each partition (only one sense amplifier is shown in FIG. 2 and will be described in the following, the remaining having a similar structure).

The example shown and described refers to the already mentioned "voltage ramp" reading technique. This should be not intended as limitative and other embodiments for the present invention utilize other techniques.

The biasing voltage generator 125 comprises a differential amplifier Ad having a relatively high gain, an inverting input terminal (denoted in FIG. 2 with the symbol "−") and a non-inverting input terminal (denoted in FIG. 2 with the symbol "+"). The differential amplifier Ad receives as power supply the first reference voltage GND and a supply voltage Vdd (for example, 1.8V). The non-inverting terminal of the differential amplifier Ad receives a second reference voltage Vrif provided by a voltage generator 205, which is adapted to generate very stable and not very sensitive to the process variations (such as temperature and/or of power supply variations) voltages. In the example at issue, the voltage generator 205 may be a so-called "band-gap reference" voltage generator.

The second reference voltage Vrif is the voltage, which is desired to have at the drain terminal of the selected memory cell MC (that is, the voltage of the bit line to which the selected cell belongs) during the real reading of the data stored by the memory cell.

The differential amplifier Ad is connected to a native n-channel MOSFET M1. In particular, the transistor M1 has the gate terminal connected to an output terminal of the differential amplifier Ad and the source terminal connected to the inverting terminal of the differential amplifier Ad as a negative feedback structure having a unit gain. Moreover, the gate terminal of the transistor M1 is connected to a first output terminal of the biasing voltage generator 125 providing a first biasing voltage CASC. The inverting terminal of the amplifier Ad is also connected to a current generator 210 providing an operative current Ic.

According to an embodiment of the invention, the operative current Ic has a value which is significantly lower than the comparison current I0 (for example, approximately ⅙, for example approximately 1 μA).

A capacitor C1 is preferably provided at the output terminal of the differential amplifier Ad. In particular, the capacitor C1 has a first terminal connected to the output terminal of the differential amplifier Ad and a second terminal which is kept grounded. The capacitor C1 is adapted to reduce the voltage disturbs of the gate terminal of the transistor M1, thus maintaining stable the first biasing voltage CASC.

The drain terminal of the transistor M1 is coupled to a load, for example comprising a p-channel MOSFET P1 belonging to a pair of p-channel MOSFETs P1 and P2 connected as a current mirror circuital configuration, for example having a unitary mirroring ratio. In particular, the drain terminal of the transistor P1 is connected to the drain terminal of the transistor M1. Moreover, the transistors P1 and P2 receive from a supply line the supply voltage Vdd and they have the gate terminals connected together and further connected to the drain terminal of the transistor P1, which is connected as a diode. The drain terminal of the transistor P2 is connected to the drain terminal of an n-channel MOSFET M3, also connected as a diode. In greater detail, the transistor M3 has the gate terminal connected to the drain terminal thereof, whereas the source terminal is kept grounded. The drain terminal of the transistor M3 is connected to a second output terminal of the biasing voltage generator 125, which provides the second biasing voltage NREF.

The sense amplifier 120 provides for a first and second input terminals 260 and 265, for receiving thereby the biasing voltages CASC and NREF, respectively.

The sense amplifier 120 comprises a circuitry adapted to charge the bit line BL of the selected memory cell MC during a precharging phase of the reading operation of the memory cell MC, and to sense the data stored in the cell during a subsequent valuation phase. Moreover, an enabling/disabling circuitry comprising in the example at issue a p-channel MOSFET P3 adapted for the selective connection to the supply line, and a switch, for example a n-channel MOSFET adapted for kept grounded the bit line BL is provided.

In greater detail, the sense amplifier 120 comprises a n-channel MOSFET M4 which has the gate terminal connected to the second input terminal 265, thus receiving the second biasing voltage NREF, the source terminal kept grounded and the drain terminal coupled (for example, by means of one or more bit line select transistors, not shown in figure, belonging to the column decoder and selector 110c) to the bit line BL of the selected memory cell MC. The transistors M3 and M4 are thus connected in a current mirror circuital configuration, having a mirroring ratio k.

A n-channel MOSFET M2 has the gate terminal connected to the first input terminal of the sense amplifier 120 (and thus to the gate terminal of the transistor M1), thereby receiving the first biasing voltage CASC, and the source terminal connected to the drain terminal of the transistor M4. In detail, the transistors M2 and M1 have a ratio between the corresponding aspect ratios denoted in the following as a. When the ratio between the corresponding currents is equal to the ratio between the respective aspect ratios, the source terminals of the transistors M1 and M2 bring themselves to the same potential.

The transistor M2 has the drain terminal connected to the drain terminal of a p-channel transistor P4, which has the gate terminal connected to the drain terminal thereof, thereby being connected as a diode. The transistor P4 has the gate terminal connected to the gate terminals of two p-channel MOSFETs P5 and P6. The pairs of transistors P4-P5, and P4-P6 are connected in current mirror circuital configurations, with corresponding mirroring ratios I and h. Moreover, the source terminals of the transistors P4, P5 and P6 are connected to a common voltage line 215. The common voltage line 215 is connected to the drain terminal of the transistor P3, which has the gate terminal receiving an activation signal DATALATCH, and the source terminal receiving the supply voltage Vdd. The common voltage line 215 is adapted to be brought to the supply voltage Vdd.

Moreover, the transistor P5 has the drain terminal which is connected to a load comprising an n-channel MOSFET N3 and belongs, with an n-channel MOSFET N2, to a precharging circuitry 270. In greater detail, the drain terminal of the transistor P5 is connected to the drain terminal of the transistor N3, having the source terminal kept grounded. The transistors N2 and N3 have the gate terminals connected together and further connected to the drain terminal of the transistor N3, and are thus connected as a diode.

The transistor N2 has the drain terminal connected to the common voltage line 215 and the source terminal connected to the drain terminal of the transistor N1. The drain terminal of the transistor N1 is also connected to the bit line BL of the selected memory cell MC. Moreover, the transistor N1 has the source terminal kept grounded, whereas the gate terminal thereof receives the activation signal DATALATCH.

The transistor P6 has the drain terminal connected to the source terminal of a p-channel MOSFET P7, which has the drain terminal connected to the drain terminal of a n-channel MOSFET M5 and the gate terminal receiving the control signal PRECH. The transistor M5 has the source terminal kept grounded, whereas the gate terminal thereof is connected to the gate terminal of the transistor M3. The transistors M5 and M3 are connected in a current mirror circuital configuration having a mirroring ratio j. The transistor M5 has the drain terminal connected to an output stage 220 comprising two n-channel MOSFETs N4 and N5 and a p-channel MOSFET P8. In greater detail, the transistor N4 has the source terminal connected to the drain terminal of the transistor P7. Moreover, the transistor N4 has the gate and the drain terminals connected together, thus resulting connected as a diode configuration. The transistor P8 has the gate terminal connected to the source terminal of the transistor N4 and the source terminal connected to the common voltage line 215. The transistor N5 has the drain terminal connected to the drain terminal of the transistor P8, the source terminal that is grounded while the gate terminal thereof is connected to the gate terminal of the transistor M3.

In this way, the transistors M3 and N5 are connected in a current mirror circuital configuration, having for example a unitary mirroring ratio. Finally, the drain terminal of the transistor N5 and thus also the drain terminal of the transistor P8 are connected to an output terminal of the sense amplifier 120, the voltage thereof forming an output voltage of the sense amplifier 120 and being also denoted as OUT2.

Moreover, in FIG. 2 the parasitic capacitors (such as for example the parasitic capacitors of the transistors M2, M4 and N2 and the selected memory cell MC and the parasitic capacitor of the bit line BL) which are associated with the source terminal of the transistor M2 are depicted as lumped circuit elements.

In an embodiment of the invention, the transistors P1, P2 and M1 of the biasing voltage generator 125, the p-channel transistors P4, P5 and P6 and the n-channel transistors M2, M3, M4, N2, N4 and N5 of the sense amplifier 120 are of the so-called "native" type (that is, MOSFETs having a low threshold voltage, which is determined only by the dopant level of the semiconductor well wherein the MOSFET is formed, without any additional dopant implant in order to modify the threshold voltage value thereof). The native MOSFETs, thanks to the low threshold voltage thereof, offer the advantage of conducting current also with low supply voltages. On the other hand, during the operation of the device, the lower the supply voltage, the lower the power dissipation.

In FIG. 2 a combinatorial logic circuit is also shown, forming a control circuitry 225 adapted for generating the activation signal DATALATCH, in response to the signals PRECH, SANABLE and OUT2. In detail, the control circuitry 225 comprises a first NOR logic gate 230 connected to a second NOR logic gate 235. In particular, the NOR logic gate 230 has two input terminals which respectively receive the second output voltage OUT2 and the control signal PRECH and has the output terminal connected to one of two inputs of the NOR logic gate 235. The control signal line which brings a complement logic signal SENABLE_N of the enabling signal SEANABLE is coupled to the remaining input of the logic gate 235. The output terminal of the logic gate 235 is connected to the input terminal of an inverter 240, which in output drives the line of the activation signal DATALATCH.

During the operation of the device, and in particular during a reading operation of a selected memory cell MC, the biasing voltage generator 125 is kept turned on and generates the first and the second biasing voltages CASC and NREF, which are provided to the sense amplifier 120 through the first and second input terminals 260 and 265, thus respectively setting the voltages of the gate terminal of the transistor M2 and the drain terminal of the transistor M3. In particular, the current generator 210 provides the operative current Ic flowing through the transistor M1. As already described in the foregoing, the operative current Ic has a significantly lower value than the comparison current I0 used for discriminating when a cell is conductive or not. In particular, the operative current Ic follows the following relation:

$$Ic=I0/(m*k)$$

wherein k is the mirroring ratio of the current mirror circuital structure formed by the transistors M3 and M4, and m is a parameter having an integer value higher than one.

The transistors P1 and P2 mirror the operative current Ic into the transistor M3. The voltage of the drain terminal (that is the second biasing voltage NREF) of the transistor P2 drives the transistor M4 by means of the second input terminal 265.

The current flowing through the transistor M4 is proportional to the operative current Ic, with a proportionality factor of value equal to the mirroring ratio k between the transistors M3 and M4. In other words, during the reading operation, the transistor M4 is turned on and conducts a current whose the value is proportional to the operative current Ic, for example an amplified current value, approximately equal to k times the value of the operative current Ic.

In greater detail, the reading operation of the selected memory cell MC is performed in two distinct phases: a precharging phase of the selected bit line BL, and an evaluation phase of the data stored in the addressed memory cell MC. In particular, during the precharging phase, the parasitic capacitor Cp is charged bringing a potential YMS of the bit line BL to a precharging potential VBL, whereas during the evaluation phase the data stored in the selected memory cell MC is read, by sensing the switching of the output voltage OUT2. In other words, the output voltage OUT2 switches when the memory cell MC conducts a current Icell higher than the comparison current I0, there providing, for comparison with the switching times of the analogous outputs of the sense amplifiers associated to the reference cells MR0, MR1 and MR2, an indication of the data stored in the memory cell MC. As the gate voltage increases, the current flowing through the memory cell MC increases, the potential YMS of the bit line BL falls with respect to the precharging potential VBL which is reached at the end of the precharging phase, and when a current Icell=I0 flows through the cell, the bit line brings itself to the second reference voltage Vrif.

With reference to FIGS. 2 and 3, let it be assumed that, at a generic instant t0, the address code ADD is received by the memory device, and that such address code ADD identifies (through the respective word line WL and the respective bit line BL) the memory cell MC shown in FIG. 2. The row decoder and selector 110r selects the word line WL to which the memory cell MC belongs by electrically coupling it to the voltage generator block 135, whereas the column decoder and selector 110c selects the bit line BL to which the memory cell MC belongs, by electrically coupling it (through the select transistors not shown in the drawing) to the sense amplifier 120.

Thereafter, at an instant t1, the precharging phase starts, during which the control unit 130 asserts the precharging signal PRECH and the enabling signal SAENABLE, bringing them to a high voltage level (for example, 1.8V).

In response to the assertion of the precharging signal PRECH and the enabling signal SAENABLE, the control circuitry 225 deasserts (bringing it to the logic value 0, typically, the ground) the activation signal DATALATCH. Indeed, when the precharging signal PRECH is at the high logic level, regardless of the value taken by the output voltage OUT2, the output of the logic gate 230 reaches the low logic level. In turn, the output of the logic gate 235 brings itself to the high logic level. In such a way, the activation signal DATALATCH is brought to the low logic level, that is, it is deasserted. The deasserted activation signal DATALATCH turns on the transistor P3.

In the precharging phase, the reading voltage Vg takes a substantially zero value. In such a way, the selected memory cell MC is turned off, so that it can not conduct any current (that is the current Icell takes a value which is approximately zero).

As already described in the foregoing, the transistor P3 is turned on, thus bringing the common voltage line 215 to the supply voltage Vdd. Moreover, the activation signal DATALATCH turns off the transistor N1, whereas the precharging signal PRECH turns off the transistor P7. The transistor P6, since it is connected in series to the transistor P7, can not conduct any current, so resulting turned off, as well.

At the beginning of the precharging phase, the transistor M4 is turned on and the value of the potential YMS of the bit line BL has a very low value, approximately zero. This is due to the fact that just before that the sense amplifier 120 is enabled for the reading operation, the transistor N1 is turned on bringing the bit line BL of the selected memory cell MC to ground.

The transistor M2 receives the first biasing voltage CASC from the biasing voltage generator 125 and thus it is turned on, since the first biasing voltage CASC is higher than the threshold voltage thereof. In particular, the transistor M2 is adapted for biasing the bit line BL.

The current flowing through the transistor M2 is mirrored into the circuital branch formed by the transistors P5 and N3 by means of the mirror formed by the transistors P4 and P5. Thus, the transistor N3 is turned on, and the voltage of the gate terminal thereof drives the transistor N2 that results turned on. Indeed, the transistor N2, being a native type transistor, has a low threshold voltage and in particular lower than the threshold voltage of the transistor N3. In such a way, at the starting of the precharging phase of the bit line BL, when the transistor N3 is turned on, also the transistor N2 results turned on.

The currents flowing trough the transistors M2 and N2 charge the parasitic capacitor Cp bringing the potential YMS to the precharging potential VBL. In particular, during the precharging phase, the potential YMS of the bit line BL, starting from an approximately zero value, reaches the precharging potential VBL. When the bit line reaches the precharging potential VBL (or a slightly lower potential), the transistor N2 turns off, and thus the precharging circuit 270 turns off.

In other words, at the beginning of the precharging phase, the transistor N2 has a driving voltage at least equal to the threshold voltage thereof, thus resulting in the transistor being turned on. In such a way, the precharging circuit 270 provides the current needed for charging the parasitic capacitor Cp. When the precharging phase is almost ended, the potential of the bit line BL brings itself to a value such as to reduce the driving voltage of the transistor N2 to a value lower than the threshold voltage thereof, and the transistor N2 turns off. It is observed that the precharging circuit 270 should be not also provided and in such case the precharge should be entrusted to the branch formed by the transistors P4 and M2.

It is noted that the first biasing voltage CASC depends on the value of the operative current Ic, thereby affecting the value to which the potential of the bit line BL brings itself at the end of the precharging phase. In other words, since the transistor M1 and the current generator 210 are connected in series, the transistor M1 is turned on, conducting the operative current Ic (for example, Ic=1 µA). In such a way, the voltages of the gate terminals of the transistors M1 and M2 (that is, the first biasing voltage CASC) depend on the value of the operative current Ic.

The currents flowing through the transistors M2 and M4 are proportional to the operative current Ic and have a significantly lower value than the comparison current I0. In particular, the precharging potential VBL to which the bit line BL brings itself at the end of the precharging and to which it remains during the evaluation phase until that the memory cell MC is turned off, is slightly higher than the second reference voltage Vrif. In particular, the higher the value of the current parameter m is, the lower the operative current Ic than the comparison current I0. Thus, the higher the parameter m, the higher the precharging potential VBL than the second reference voltage Vrif. Since the evaluation operation of the data stored requires that the voltage of the drain terminal of the memory cell MC to be read is equal to the second reference voltage Vrif, the current parameter m is such that (as will be described in detail in the following) the time required from the bit line BL for bringing itself from the precharging potential VBL to the value of the second reference voltage Vrif does not increase significantly the reading time.

During the precharging phase, the transistor M5 is turned on, so conducting a proportional current to the operative current Ic (such current flows from the common voltage line 215 through the transistors P8 and N4).

In particular, the current flowing through the transistor M5 is equal to the operative current Ic amplified of a value equal to the mirroring ratio j between the transistors M3 and M5.

The output circuit 220 receives at the input thereof a first output voltage OUT1 (that is the voltage of the drain terminal of the transistor P7) that turns on the transistor P8. Simulations of the circuit shown in FIG. 2 have pointed out that, during the reading operation of the selected memory cell MC, the value of the voltage OUT2 is lower than the supply voltage Vdd (for example, approximately equal to 1.2V). In such a way, the transistor N4 is turns on, thus bringing the first output voltage OUT1 to a value (for example, approximately 1V) close to the value of the output voltage OUT2 minus the threshold voltage of the transistor N4.

Also the transistor N5 is turned on, thereby conducting a current proportional to the operative current Ic. In particular, the current flowing through the transistor N5 is equal to the operative current Ic amplified by a value equal to the mirroring ratio between the transistors M3 and N5.

After a predetermined time (for example, 15 ns) sufficiently long for ensuring the complete precharge of the bit line BL, at an instant t2 the control unit 130 deasserts the precharging signal PRECH, bringing it to the low logic level (that is, to ground). Thus, the precharging phase ends, and the reading phase of the data stored in the selected memory cell MC starts.

From the instant t2, the reading voltage Vg, starting from a very low value, for example approximately zero, increases, for example linearly, reaching the final value Vf at the instant t3. In particular, considering for simplicity and merely by way of example the case wherein the selected memory cell MC is programmed (meaning that the memory cell MC has a relatively high threshold voltage, for example equal to the value VgTH), until the reading voltage Vg reaches the threshold voltage VgTH of the cell, essentially no current flows through the memory cell MC.

In such a way, the same current of the transistor M4 continues to flow through the transistor M2 and the output voltage OUT2 remains at the voltage level to which it was brought itself during the preceding precharging phase.

The control signal PRECH at the low logic level turns the transistor P7 on, which in such a way can conduct a current which is a mirroring of the current flowing through the transistor P4, and thus through the transistor M2.

When the reading voltage Vg reaches and exceeds (at the instant t3) the value of the threshold voltage VgTH of the memory cell MC, the cell turns on, starting to conduct a current Icell.

In a such biasing condition, the transistor M2 conducts a current gradually higher than the current, which it was able to conduct during the preceding precharging phase. In particular, the transistor M2 conducts an additional current equal to the value of the current Icell flowing through the selected memory cell MC.

When the current Icell of the selected memory cell MC is equal to the value of the comparison current I0, the potential VMS of the bit line BL falls to the second reference voltage Vrif. For this purpose, the transistors M2 and M1 are designed (for example, the factor a=9) so that when the current Icell of the memory cell MC has a value equal to the comparison current I0, the potential of the bit line BL brings itself to the value of the second reference voltage Vrif.

When the current Icell of the selected memory cell MC is equal to the comparison current I0, so that the second output signal OUT2 remains to the level taken during the precharging phase, the current coming from the transistor P6 has to flow through the transistor M5. Thus the following relations holds:

$$k*Ic+I0=j*Ic \quad (1)$$

$$h*IM2=j*Ic \quad (2)$$

in which the term (k*Ic+I0) indicates the current flowing through the transistor M2 (denoted in the relation (2) with IM2), which is mirrored into the transistor P6. Moreover, the term j*Ic indicates the current flowing through the transistor M5.

Moreover, the current IM2 of the transistor M2 depends on the current Ic, that is it follows the following relation:

$$IM2=a*Ic \quad (3)$$

Substituting the relation (2) in the relation (3) it follows that:

$$h*a*Ic=j*Ic \rightarrow h*a=j \quad (4)$$

wherein h indicates the mirroring ratio between the transistors P4 and P6, a is the ratio between the aspect ratio of the transistors M2 and M1 and j is the mirroring ratio of the mirror of transistors M3 and M5.

Moreover, as already described previously, the operative current Ic is a fraction of the comparison current I0 so that it results:

$$Ic=I0/(m*k) \quad (5)$$

Substituting the relation (5) in the relation (3), it is obtained:

$$a=(m+1)/m*(k*m) \quad (6)$$

For example, starting from a comparison current I0 equal to 6 μA and assuming of using, for charging the parasitic capacitor Cp of the bit line BL, a current approximately of 3 μA (for having a reasonably short time charge, thanks to the current contribute of the precharging circuit 270), the operative current Ic can be chosen equal to 1 μA and the mirroring ratio can be chosen approximately equal to 3, from the relations (5) and (6) it is thus obtained:

m=2;

a=9.

From the relation (4) it is noted that the value of the parameter h affects the value of the parameter j. In particular, for a fixed value of the parameter a (in the example at issue a=9), as the value of the parameter j increases also the value of the parameter h increases.

The parameter j provides an indication regarding the speed at which the first output voltage OUT1 switches. In other words, the switching rate of the first output voltage OUT1 depends on the time that the parasitic capacitor of the connecting circuital node between the transistor N4 and the transistor P7 spends for charging itself and thus depends on the charging current flowing, which may also be referred to as a residual current, through such capacitor. In particular, as the parameter j increases, also the charging current variation increases for variations of the cell current Icell.

On the other hand, the parameter h provides an indication of the size of the transistor P6 with respect to the transistor P4. In particular, when the parameter h takes a significantly high value the parasitic capacitor of the connecting circuital node between the transistor N4 and the transistor P7 increases, so increasing the reading time.

A possible choice of the parameters consists for example setting j=a. It is thus obtained:

j=9.

Alternatively, it is possible to set j=k.

It is noted that the parameter m provides an indication of the current flowing through the transistor M2 (and through the transistor M4) at the end of the charging phase of the bit line, with respect to the predetermined value of the comparison current I0: in the considered example, such current is approximately equal to half of the comparison current I0.

When the value of the current Icell exceeds the comparison current I0, the sense amplifier 120 detects the conduction of the selected memory cell MC by the switching of the output voltage OUT2. In particular, the output voltage OUT2 switches from the value taken during the precharging phase to the complementary logic value thereof (that is, ground). In other words, until the current Icell is lower or at least equal to the value of the comparison current I0, the output voltage OUT2 remains at the value taken during the precharging phase of the bit line BL, and vice versa when it exceeds the comparison current I0, the output voltage OUT2 switches from the high value (that is, approximately equal to 1.2V) to the low value (that is, ground), thus providing, by means of a verify, at the switching instant of the output voltage OUT2 in the sense amplifier connected to the memory cell, of the state of the outputs of the other sense amplifiers connected to the reference cells, the indication of the data stored in the memory cell MC. In particular, when the current Icell is higher than the comparison current I0, the current flowing through the transistor M2 increases of an excess current value equal to the difference between the value of the current Icell and that of the comparison current I0. The current of the transistor M2 is replicated by the current mirror formed by the transistors P4 and P6 and the current which flows through the transistor P6 in excess with respect to the current j*Ic flowing through the transistor M5, is sunk from the output stage 220, in particular by the transistor N4, and such current discharges to ground through the transistor N5. In such conditions, the value of the first output voltage OUT1 increases and the transistors N4 and P8 turn off. Instead, the transistor N5 continues to conduct, and subsequently the output voltage OUT2 falls to the low level (that is ground).

The switching of the output voltage OUT2 is detected by the control circuitry 225 which asserts the activation signal DATALATCH, thus bringing the bit line BL to ground (through the transistor N1) and turning off the transistor P3. In such a way, the sense amplifier 120 is disabled.

It is pointed out that the above-described embodiment, in which the voltage OUT1, before the cell starts conducting a current equal to the comparison current I0, is substantially kept at the high value of the output voltage OUT2 minus the threshold voltage of the transistor N4, that is approximately at the half between the ground and the supply voltage Vdd, allows reducing the reading time of the data stored in the selected memory cell MC. Indeed, the first output voltage OUT1, starting from a value close to the value of the output voltage OUT2, reaches the supply voltage Vdd faster than the case in which the cell starts from a lower potential, for example ground.

However, this does not exclude that a further embodiment of the present invention employs an output stage having a different structure from the described one. For example, in an alternative embodiment the transistor N4 could be omitted. In such a way, during the precharging phase of the bit line BL the first output voltage OUT1 should result kept grounded through the transistor M5.

The structure of the reading circuitry according to embodiments of the present invention provides for all the sense amplifiers only one common biasing generator. This allows a significant reduction in terms of device current consumption, thanks to the fact that the biasing voltage generator is common to the sense amplifiers of all the partitions, and the biasing voltages generated are used from time to time by the sense amplifiers corresponding to the memory cells to be read.

Moreover, by choosing a significantly low value of the operative current Ic, it is possible further to reduce the current consumption.

Moreover, this is particularly advantageous in memory devices with a high number of partitions of the memory matrix.

A further contribution to the reduction of the current consumption, is given by the fact that the sense amplifier 120 provides a mirroring circuitry of the operative current Ic adapted for sensing the current flowing through the selected memory cell without recurring to the use of differential amplifiers, which require currents significantly higher than the operative current Ic during the operation thereof.

Moreover, according to embodiments of the present invention include a reduced number of differential amplifiers in the biasing voltage generator (in the example at issue one only differential amplifier), thus reducing the occupied area within the semiconductor material chip.

Naturally, in order to satisfy local and specific requirements, a person skilled in the art may apply to the solution described above many modifications and alterations. Particularly, although the present invention has been described with a certain degree of detail with reference to embodiments thereof, it should be understood that various omissions, substitutions and changes in the form and details as well as other embodiments are possible.

For example, similar considerations apply if the memory device has a different structure or includes equivalent elements (for example, with multilevel memory cells).

Moreover, although described relating to a memory device wherein the used reading voltage has a linearly increasing pattern, nothing prevents reading voltages having different patterns, or reading techniques different from the one with gate voltage ramp.

Moreover, nothing prevents starting from a non-zero value of the reading voltage during the precharging phase of the bit line.

In addition, it is possible to apply embodiments of the present invention also during verify operations of the programming operations which are performed on the memory device.

For example, similar considerations apply if the precharging circuitry of the bit line has a different structure from those described.

Moreover, it is possible to apply embodiments of the present invention using different values of the operative current and the comparison current.

In addition, although described relating to a sense amplifier wherein the transistors are of MOSFET type, nothing prevents applying the solution according to embodiments of the present invention with bipolar transistors.

Memory devices including read circuitry according to embodiments of the present invention may be contained in a variety of different types of electronic systems, such as computer systems, cellular telephones, memory cards, portable digital assistants (PDAs), and so on.

From the foregoing it will be appreciated that, although specific embodiments of the invention have been described herein for purposes of illustration, various modifications may be made without deviating from the spirit and scope of the invention.

The invention claimed is:

1. A sensing circuit for a semiconductor memory, comprising at least one sense amplifier, said sense amplifier comprising:
   a first circuital branch adapted to be electrically run through by a first current corresponding to the sum of a second current as a function of a comparison current and a cell current, said cell current being a function of a state of a memory cell to be read in a predetermined biasing condition;
   a second circuital branch coupled as a current mirror configuration with the first circuital branch, said second circuital branch being adapted in the operation to be run through by a third current proportional to the first current;
   a third circuital branch coupled to said second branch, said third circuital branch being adapted in the operation to sink a fourth current as a function of said comparison current;
   a fourth circuital branch coupled to said second and third circuital branches, said fourth circuital branch being adapted in the operation to be run through by a residual current equal to the difference between the third and the fourth current, said residual current assuming different values depending on the fact that the cell current is lower, equal or higher than the comparison current; and
   residual current sensitive means adapted to generate an indication of the state of the memory cell as a function of a value of the residual current.

2. A sensing circuit for a semiconductor memory, comprising at least one sense amplifier, said sense amplifier comprising:
   a first circuital branch adapted to be electrically run through by a first current corresponding to the sum of a second current as a function of a comparison current and a cell current, said cell current being a function of a state of a memory cell to be read in a predetermined biasing condition;
   a second circuital branch coupled as a current mirror configuration with the first circuital branch, said second circuital branch being adapted in the operation to be run through by a third current proportional to the first current;
   a third circuital branch coupled to said second branch, said third circuital branch being adapted in the operation to sink a fourth current as a function of said comparison current;
   a fourth circuital branch coupled to said second and third circuital branches, said fourth circuital branch being adapted in the operation to be run through by a residual current equal to the difference between the third and the fourth current, said residual current assuming different values depending on the fact that the cell current is lower, equal or higher than the comparison current;
   residual current sensitive means adapted to generate an indication of the state of the memory cell as a function of a value of the residual current; and
   wherein said first current is a current proportional to the comparison current.

3. The sensing circuit according to claim 2, wherein said first current is lower than said comparison current.

4. The sensing circuit according to claim 1, wherein said fourth current is higher than said comparison current.

5. The sensing circuit according to claim 1, wherein the first circuital branch comprises a first transistor and a second transistor in series to the first transistor, said first transistor being connected as a diode configuration, and said second transistor having a control terminal adapted for receiving a first biasing voltage.

6. The sensing circuit according to claim 5, wherein said first circuital branch is connected to a fourth circuital branch, said fourth circuital branch comprising a third transistor with a control terminal adapted to receive in the operation a second biasing voltage such that said fourth circuital branch is run through by a fifth proportional current and lower than the comparison current.

7. The sensing circuit according to claim 6, further comprising a biasing voltage generation circuit, adapted to provide said first and second biasing voltages.

8. The sensing circuit according to claim 7, comprising at least two detecting amplifiers, said biasing voltage generation circuit being common to said at least two sense amplifiers.

9. A sensing circuit for a semiconductor memory, comprising at least one sense amplifier, said sense amplifier comprising:
   a first circuital branch adapted to be electrically run through by a first current corresponding to the sum of a second current as a function of a comparison current and a cell current, said cell current being a function of a state of a memory cell to be read in a predetermined biasing condition;
   a second circuital branch coupled as a current mirror configuration with the first circuital branch, said second circuital branch being adapted in the operation to be run through by a third current proportional to the first current;
   a third circuital branch coupled to said second branch, said third circuital branch being adapted in the operation to sink a fourth current as a function of said comparison current;
   a fourth circuital branch coupled to said second and third circuital branches, said fourth circuital branch being adapted in the operation to be run through by a residual current equal to the difference between the third and the fourth current, said residual current assuming different values depending on the fact that the cell current is lower, equal or higher than the comparison current; and
   residual current sensitive means adapted to generate an indication of the state of the memory cell as a function of a value of the residual current;
   wherein the first circuital branch comprises a first transistor and a second transistor in series to the first transistor, said first transistor being connected as a diode configuration, and said second transistor having a control terminal adapted for receiving a first biasing voltage;
   wherein said first circuital branch is connected to a fourth circuital branch, said fourth circuital branch comprising a third transistor with a control terminal adapted to receive in the operation a second biasing voltage such that said fourth circuital branch is run through by a fifth proportional current and lower than the comparison current;

wherein the sensing circuit further comprises a biasing voltage generation circuit, adapted to provide said first and second biasing voltages; and wherein said biasing voltage generation circuit comprises a voltage regulator adapted to provide said first biasing voltage as a function of an operative current proportional and lower than the comparison current, said voltage regulator comprising a differential amplifier and a fourth transistor, said differential amplifier having an output terminal adapted for being connected to a control terminal of the fourth transistor and to the control terminal of the second transistor, an inverting input adapted for being connected to a first terminal of said fourth transistor according to a negative feedback configuration, and a non-inverting input adapted to receive the reference voltage, said fourth transistor being run through in the operation by the operative current.

10. The sensing circuit according to claim 9, wherein said first biasing voltage is such that a voltage at a first terminal of the second transistor coupled to the memory cell is equal to the reference voltage when the cell current is equal to said comparison current.

11. The sensing circuit according to claim 9, wherein said voltage regulator comprises a fifth and a sixth circuital branch, said sixth circuital branch having a current mirror configuration with the fifth circuital branch and adapted in the operation to be run through by said operative current.

12. The sensing circuit according to claim 11, wherein said fifth circuital branch comprises a fifth transistor in series to the fourth transistor, said fifth transistor being connected as a diode configuration and said sixth circuital branch comprising a sixth transistor and a seventh transistor connected in series to the seventh transistor, said seventh transistor being coupled as a diode configuration and having a second terminal which provides the second biasing voltage.

13. The sensing circuit according to claim 9, wherein said first circuital branch is adapted for being electrically coupled to a bit line connected to said memory cell to be read, said first circuital branch comprising means for biasing said bit line to a precharging potential during the precharging phase of a reading operation of the memory cell to be read.

14. The sensing circuit according to claim 9, wherein said precharging potential is higher than the reference voltage.

15. The sensing circuit according to claim 13, wherein said detecting amplifier comprises a precharging circuit of said bit line, adapted to be activated during the precharging phase of the reading operation of the data stored by the cell.

16. The sensing circuit according to claim 13, wherein said precharging circuit comprises an eighth transistor and a ninth transistor connected as a diode configuration, said ninth transistor being connected in series to a tenth transistor, said eighth transistor having a second terminal adapted for receiving a supply voltage and a first terminal connected to the fourth circuital branch, said eighth transistor having a threshold voltage lower than of the threshold voltage corresponding to said ninth transistor.

17. The sensing circuit according to claim 1, wherein said second branch has an eleventh transistor connected in series to a twelfth transistor, said twelfth transistor having a control terminal adapted to receive a control voltage.

18. The sensing circuit according to claim 17, wherein said control voltage is adapted for enabling the second circuital branch during a valuation phase of a reading operation of the memory cell to be read.

19. The sensing circuit according to claim 1, wherein said fourth circuital branch comprises a thirteenth transistor and a fourteenth transistor connected in series to a fifteenth transistor, said thirteenth transistor being connected as a diode configuration and having a first terminal connected to the third circuital branch and a second terminal connected to the second terminal of the fourteenth transistor.

20. A semiconductor memory comprising at least one memory cell and a sensing circuit for detecting a state of the memory cell, wherein the sensing circuit is realized according to claim 1.

21. A reading method of a semiconductor memory cell, comprising the phases of:
flowing a first current corresponding to the sum of a second current as a function of a comparison current and a cell current, said cell current being a function of a state of a memory cell to be read in a predetermined biasing condition;
mirroring said first current so as to obtain a third current proportional to the first current;
sinking from said third current a fourth current as a function of said comparison current;
obtaining a residual current equal to the difference between the third and the fourth current; and
generating an indication of the state of the memory cell as a function of a value of the residual current, said residual current assuming different values as a function of the fact that the current cell is lower, equal or higher than the comparison current.

22. A sensing circuit for a semiconductor memory, comprising at least one sense amplifier, said sense amplifier comprising:
a first current circuit operable to provide a first current, the first current corresponding to the sum of a cell current and a second current having a value that is a function of a comparison current, the cell current having a value that is a function of a state of a memory cell being read;
a current mirror coupled to the first current circuit, the current mirror operable to provide a third current having a value that is proportional to the first current;
a second current circuit coupled to the current mirror and operable to provide a fourth current having a value that is a function of the comparison current;
a third current circuit coupled to the second current circuit and the current mirror, the third current circuit operable to provide a residual current equal to the difference between the third and fourth currents, the residual current having a value that indicates whether the cell current is lower, equal or greater than the comparison current; and
an output circuit operable to generate an output signal responsive to the residual current, the output signal having a value that is a function of the residual current.

23. The sensing circuit of claim 22, wherein the first current circuit comprises:
a first diode-coupled transistor; and
a second transistor coupled in series with the first transistor and having a control terminal configured to receive a first biasing voltage.

24. A memory device, comprising:
a matrix of memory cells;
a row decoder coupled to the matrix;
a column decoder coupled to the matrix; and a sensing circuit coupled to the column decoder, the sensing circuit including a plurality of sense amplifiers, each sense amplifier including,
- a first current circuit operable to provide a first current, the first current corresponding to the sum of a cell current and a second current having a value that is a function of a comparison current, the cell current having a value that is a function of a state of a memory cell being read;
- a current mirror coupled to the first current circuit, the current mirror operable to provide a third current having a value that is proportional to the first current;
- a second current circuit coupled to the current mirror and operable to provide a fourth current having a value that is a function of the comparison current;
- a third current circuit coupled to the second current circuit and the current mirror, the third current circuit operable to provide a residual current equal to the difference between the third and fourth currents, the residual current having a value that indicates whether the cell current is lower, equal or greater than the comparison current; and
- an output circuit operable to generate an output signal responsive to the residual current, the output signal having a value that is a function of the residual current.

25. The memory device of claim 24, wherein the matrix comprises a matrix of FLASH memory cells arranged in rows and columns.

26. An electronic system, comprising:
electronic circuitry; and
a memory device coupled to the electronic circuitry, the memory device including,
- a matrix of memory cells;
- a row decoder coupled to the matrix;
- a column decoder coupled to the matrix; and
- a sensing circuit coupled to the column decoder, the sensing circuit including a plurality of sense amplifiers, each sense amplifier including,
  - a first current circuit operable to provide a first current, the first current corresponding to the sum of a cell current and a second current having a value that is a function of a comparison current, the cell current having a value that is a function of a state of a memory cell being read;
  - a current mirror coupled to the first current circuit, the current mirror operable to provide a third current having a value that is proportional to the first current;
  - a second current circuit coupled to the current mirror and operable to provide a fourth current having a value that is a function of the comparison current;
  - a third current circuit coupled to the second current circuit and the current mirror, the third current circuit operable to provide a residual current equal to the difference between the third and fourth currents, the residual current having a value that indicates whether the cell current is lower, equal or greater than the comparison current; and
  - an output circuit operable to generate an output signal responsive to the residual current, the output signal having a value that is a function of the residual current.

27. The electronic system of claim 26, wherein the electronic circuitry comprises one of computer system circuitry, cellular telephone circuitry, PDA circuitry, portable memory unit circuitry, and portable audio/video player circuitry.

28. A method of reading a semiconductor memory cell, comprising:
- generating a first current equal to the sum of a cell current and a second current, the second current having a value that is a function of a comparison current and the cell current having a value that is a function of a state of a memory cell being read;
- generating a third current proportional to the first current;
- generating from the third current a fourth current, the fourth current having a value that is a function of the comparison current;
- generating a residual current equal to the difference between the third and fourth currents; and
- generating an indication of a state of the memory cell as a function of a value of the residual current.

* * * * *